United States Patent
Van Den Broeke et al.

(10) Patent No.: US 12,429,761 B2
(45) Date of Patent: Sep. 30, 2025

(54) MURA REDUCTION METHOD

(71) Applicant: Applied Materials, Inc., Santa Clara, CA (US)

(72) Inventors: Douglas Joseph Van Den Broeke, Santa Clara, CA (US); Chi-Ming Tsai, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 511 days.

(21) Appl. No.: 17/989,128

(22) Filed: Nov. 17, 2022

(65) Prior Publication Data

US 2023/0152684 A1     May 18, 2023

Related U.S. Application Data

(60) Provisional application No. 63/264,188, filed on Nov. 17, 2021.

(51) Int. Cl.
     *G03F 1/70*      (2012.01)
     *G03F 7/00*      (2006.01)

(52) U.S. Cl.
     CPC ............ *G03F 1/70* (2013.01); *G03F 7/70291* (2013.01); *G03F 7/70475* (2013.01); *G03F 7/70508* (2013.01)

(58) Field of Classification Search
CPC .... G03F 1/70; G03F 7/70291; G03F 7/70475; G03F 7/70508
See application file for complete search history.

(56) References Cited

U.S. PATENT DOCUMENTS

| | | |
|---|---|---|
| 10,571,809 B1 | 2/2020 | Bencher et al. |
| 2012/0117520 A1 | 5/2012 | Kitamura et al. |
| 2020/0089128 A1* | 3/2020 | Bencher .............. G03F 7/70558 |
| 2020/0150548 A1* | 5/2020 | Sallak ........................ G03F 7/20 |
| 2021/0389682 A1* | 12/2021 | Luan ................... G03F 7/70291 |

FOREIGN PATENT DOCUMENTS

| | | |
|---|---|---|
| KR | 10-2011-0082224 A | 7/2011 |
| KR | 10-2162270 | 10/2020 |
| WO | 2011-122608 A1 | 10/2011 |
| WO | 2021-071472 A1 | 4/2021 |
| WO | 2021/071484 A1 | 4/2021 |
| WO | 2022/060616 A1 | 3/2022 |

OTHER PUBLICATIONS

International Search Report and Written Opinion dated Mar. 15, 2023 for Application No. PCT/US2022/080010.

\* cited by examiner

*Primary Examiner* — Stewart A Fraser
(74) *Attorney, Agent, or Firm* — Patterson + Sheridan, LLP

(57) ABSTRACT

A system, methods, and a non-transitory computer-readable medium for digital lithography to reduce mura in substrate sections. The boundary lines of the digital lithography need to be invisible. In one example, a system includes a processing unit configured to print a virtual mask file provided by a controller. The controller is configured to receive data and convert the data into a virtual mask file having an exposure pattern for a lithographic process. The exposure pattern includes a plurality of first sections, and second sections. Each first section forms a boundary with each second section along a first column of image projection systems of the processing unit. The controller patterns the substrate. The exposure pattern includes a first section pattern of each first section that crosses the eye to eye boundary with the second section making the boundary invisible.

25 Claims, 8 Drawing Sheets

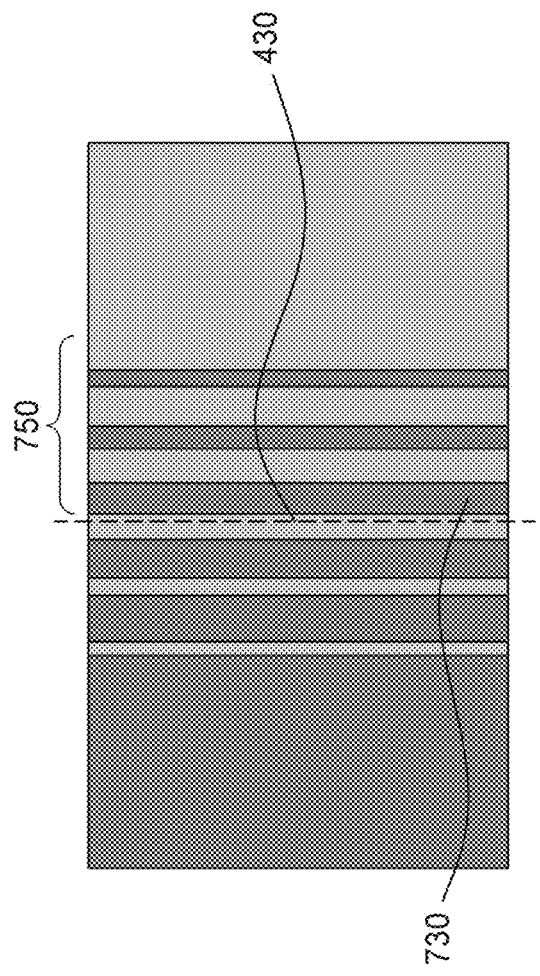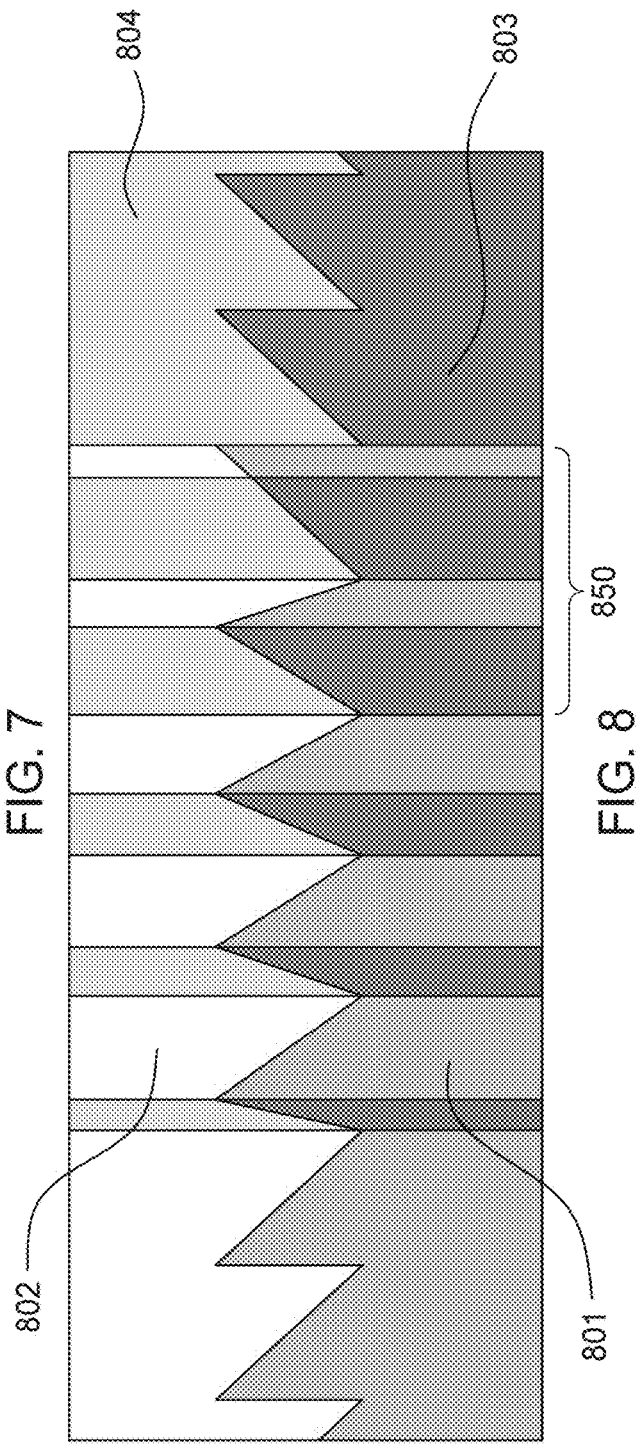

MURA REDUCTION METHOD

CROSS-REFERENCE TO RELATED APPLICATIONS

This application claims priority to U.S. Provisional Patent Application 63/264,188, filed Nov. 17, 2021, which herein is incorporated by reference.

BACKGROUND

Field

Embodiments of the present disclosure generally relate to methods and apparatus for processing one or more substrates, and more specifically to a system, methods, and a non-transitory computer-readable medium for digital lithography.

Description of the Related Art

Photolithography is widely used in the manufacturing of semiconductor devices, such as for back-end processing of semiconductor devices, and display devices, such as liquid crystal displays (LCDs). For example, large area substrates are often utilized in the manufacture of LCDs. LCDs, or flat panel displays, are commonly used for active matrix displays, such as computers, touch panel devices, personal digital assistants (PDAs), cell phones, television monitors, and the like. Generally, flat panel displays include a layer of liquid crystal material as a phase change material at each pixel, sandwiched between two plates. When power from a power supply is applied across or through the liquid crystal material, an amount of light passing through the liquid crystal material is controlled, i.e., selectively modulated, at the pixel locations enabling images to be generated on the display. In digital lithography, stitching is used on large area substrates. However, stitching is used on large area substrates may lead to mura. Accordingly, what is needed in the art are a system, methods, and a non-transitory computer-readable medium for digital lithography.

SUMMARY

In one embodiment, a system is providing. The system includes a processing unit configured to print a virtual mask file provided by a controller in communication with the processing unit. The controller is configured to receive data and convert the data into a virtual mask file having an exposure pattern for a lithographic process. The exposure pattern includes a plurality of first sections, second sections, third sections, and fourth sections. Each first section forms an eye to eye boundary with each second section along a first column of image projection systems of the processing unit and each third section forms the eye to eye boundary with each fourth section along a second column of image projection systems of the processing unit. Each first section forms a bridge to bridge boundary with each third section along a first respective row of image projection systems of the processing unit, and each second section forms the bridge to bridge boundary with each fourth section along a second respective row of image projection systems of the processing unit. The controller can pattern the substrate with the processing unit using the virtual mask file. The exposure pattern includes a first section pattern of each first section that crosses the eye to eye boundary with the second section and the bridge to bridge boundary with the third section, a second section pattern of each second section that crosses the eye to eye boundary with the first section and the bridge to bridge boundary with the fourth section, a third section pattern of each third section that crosses the eye to eye boundary with the fourth section and the bridge to bridge boundary with the second section, and a fourth section pattern of each fourth section that crosses the eye to eye boundary with the third section and the bridge to bridge boundary with the first section.

In another embodiment a method is provided. The method includes patterning with a processing unit a substrate having a photoresist disposed thereon with an exposure pattern of a virtual mask file. The exposure pattern includes a plurality of first sections, second sections, third sections, and fourth sections. Each first section forms an eye to eye boundary with each second section along a first column of image projection systems of the processing unit and each third section forms the eye to eye boundary with each fourth section along a second column of image projection systems of the processing unit. Each first section forms a bridge to bridge boundary with each third section along a first respective row of image projection systems of the processing unit, and each second section forms the bridge to bridge boundary with each fourth section along a second respective row of image projection systems of the processing unit. The exposure pattern includes a first section pattern of each first section crossing the eye to eye boundary with the second section and the bridge to bridge boundary with the third section, a second section pattern of each second section crossing the eye to eye boundary with the first section and the bridge to bridge boundary with the fourth section, a third section pattern of each third section crossing the eye to eye boundary with the fourth section and the bridge to bridge boundary with the second section, and a fourth section pattern of each fourth section crossing the eye to eye boundary with the third section and the bridge to bridge boundary with the first section.

In another embodiment, a non-transitory computer-readable medium storing instructions that, when executed by a processor, cause a computer system to perform steps is provided. The steps include patterning with a processing unit an exposure pattern of the virtual mask file. The exposure pattern includes a plurality of first sections, second sections, third sections, and fourth sections. Each first section forms an eye to eye boundary with each second section along a first column of image projection systems of the processing unit and each third section forms the eye to eye boundary with each fourth section along a second column of image projection systems of the processing unit. Each first section forms a bridge to bridge boundary with each third section along a first respective row of image projection systems of the processing unit, and each second section forms the bridge to bridge boundary with each fourth section along a second respective row of image projection systems of the processing unit. The exposure pattern includes a first section pattern of each first section crossing the eye to eye boundary with the second section and the bridge to bridge boundary with the third section, a second section pattern of each second section crossing the eye to eye boundary with the first section and the bridge to bridge boundary with the fourth section, a third section pattern of each third section crossing the eye to eye boundary with the fourth section and the bridge to bridge boundary with the second section, and a fourth section pattern of each fourth section crossing the eye to eye boundary with the third section and the bridge to bridge boundary with the first section.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 7 is a section of a bridge to bridge boundary according to a single exposure method according to embodiments.

FIG. 8 is a portion of a substrate at an eye to eye boundary and a bridge to bridge boundary according to embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to methods and apparatus for processing one or more substrates, and more specifically to a system, methods, and a non-transitory computer-readable medium for digital lithography. Specifically embodiments are a system, methods, and a non-transitory computer-readable medium for digital lithography to reduce mura in substrate sections.

Figure 1:
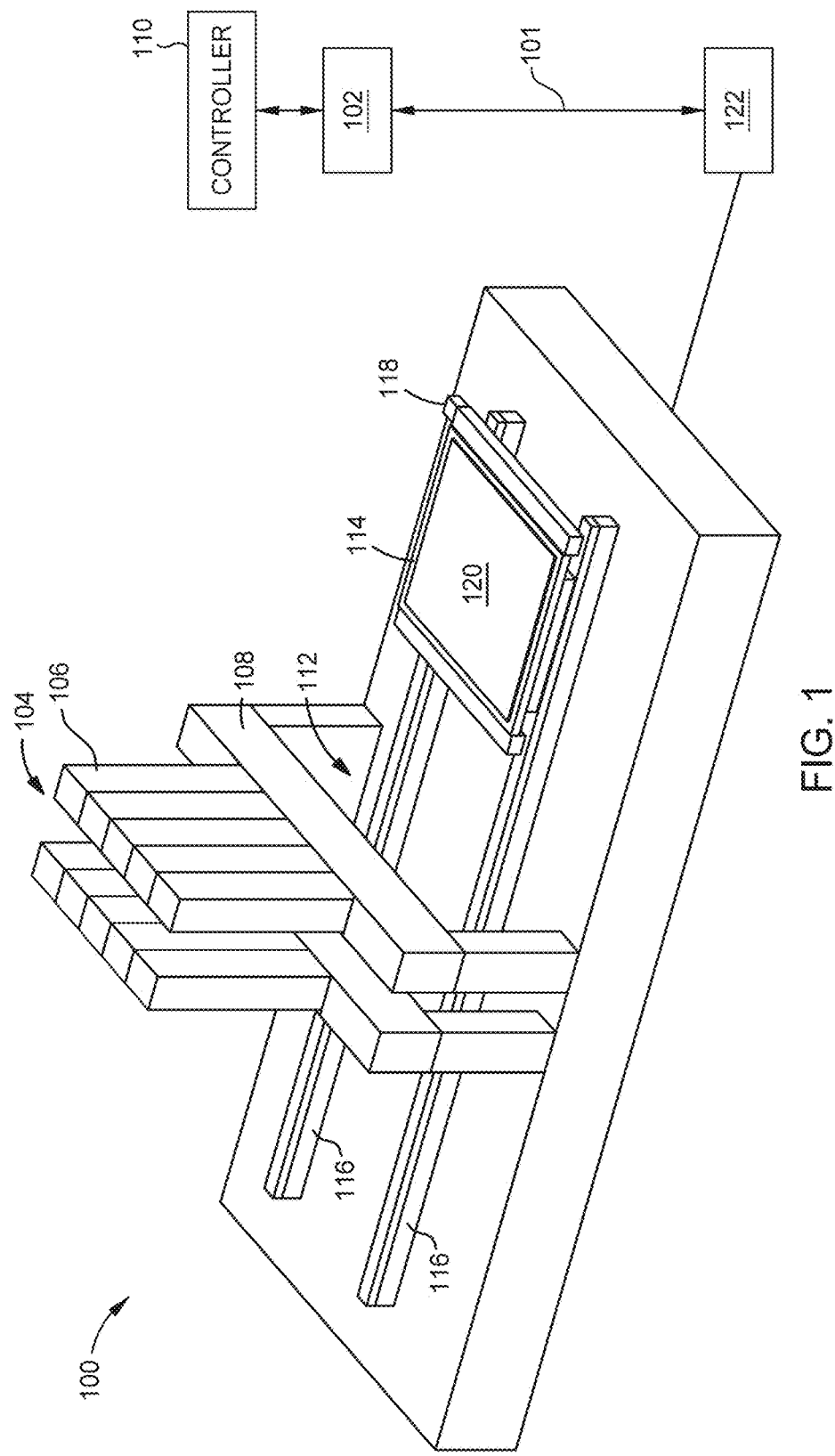
FIG. 1 is a schematic partial perspective view of a digital lithography system according to embodiments.

FIG. 1 is a schematic partial perspective view of a digital lithography system 100. The digital lithography system 100 includes a stage 114 and a processing unit 104. The stage 114 is supported by a pair of tracks 116. A substrate 120 is supported by the stage 114. The stage 114 is operable to move along the pair of tracks 116. The stage 114 can move on the tracks 116 in the x-direction and the y-direction as defined in FIG. 1. An encoder 118 is coupled to the stage 114 in order to provide information of the location of the stage 114 to a lithography controller 122. The digital lithography system 100 is in communication with a controller 110. The controller 110 is operable to deliver one or more virtual mask files corresponding to exposure patterns or the controller 110 is otherwise configured to perform processes described herein.

The lithography controller 122 is generally designed to facilitate the control and automation of the processing techniques described herein. The lithography controller 122 may be coupled to or in communication with the processing unit 104, the stage 114, and the encoder 118. The processing unit 104 and the encoder 118 may provide information to the lithography controller 122 regarding the substrate processing and the substrate aligning. For example, the processing unit 104 may provide information to the lithography controller 122 to alert the lithography controller 122 that substrate processing has been completed. The lithography controller 122 facilitates the control and automation of a digital lithography process based on a virtual mask file provided by a virtual mask software application 102. The virtual mask file, readable by the lithography controller 122, determines which tasks are to be performed on a substrate. The virtual mask file corresponds to an exposure pattern to be written into the photoresist using the electromagnetic radiation.

The substrate 120 comprises any suitable material, for example, glass, which is used as part of a flat panel display. In other embodiments, which can be combined with other embodiments described herein, the substrate 120 is made of other materials capable of being used as a part of the flat panel display. The substrate 120 has a film layer to be patterned formed thereon, such as by pattern etching thereof, and a photoresist layer formed on the film layer to be patterned, which is sensitive to electromagnetic radiation, for example UV or deep UV "light". A positive photoresist includes portions of the photoresist, when exposed to radiation, are respectively soluble to a photoresist developer applied to the photoresist after the pattern is written into the photoresist using the electromagnetic radiation. A negative photoresist includes portions of the photoresist, when exposed to radiation, will be respectively insoluble to photoresist developer applied to the photoresist after the pattern is written into the photoresist using the electromagnetic radiation. The chemical composition of the photoresist determines whether the photoresist is a positive photoresist or negative photoresist. Examples of photoresists include, but are not limited to, at least one of diazonaphthoquinone, a phenol formaldehyde resin, poly(methyl methacrylate), poly(methyl glutarimide), and SU-8. After exposure of the photoresist to the electromagnetic radiation, the resist is developed to leave an exposure underlying film layer. Then, using the patterned photoresist, the underlying thin film is pattern etched through the openings in the photoresist to form a portion of the electronic circuitry of the display panel.

The processing unit 104 is configured to expose the photoresist in the digital lithography process using one or more image projection systems (IPSs) 106. The IPSs 106 are supported by the supports 108. The supports 108 straddle the pair of tracks 116. The supports 108 provides an opening 112 for the pair of tracks 116 and the stage 114 to pass under the processing unit 104. The processing unit 104 is a pattern generator configured to receive the virtual mask file from the virtual mask software application 102. The virtual mask file is provided to the processing unit 104 via the lithography controller 122. The processing unit 104 is configured to expose the photoresist in the digital lithography process using one or more image projection systems (IPSs) 106. The one or more IPSs 106 are operable to project write beams of electromagnetic radiation to the substrate 120. The exposure pattern generated by the processing unit 104 is projected by the IPSs 106 to expose the photoresist of the substrate 120 to the exposure pattern. The exposure of the photoresist form one or more different features in the photoresist. In one embodiment, which can be combined with other embodiments described herein, each IPS 106 includes a spatial light modulator to modulate the incoming light to create the desired image. Each spatial light modulator includes a plurality of electrically addressable elements that may be controlled individually. Each electrically addressable element may be in an "ON" position or an "OFF" position based on the digital pattern file 204 (shown in FIG. 2). When the light reaches the spatial light modulator, the electrically addressable elements that are in the "ON" position project a plurality of write beams to a projection lens (not shown). The projection lens then projects the write beams to the substrate 120. The electrically addressable elements include, but are not limited to, digital micromirrors, liquid crystal displays (LCDs), liquid crystal over silicon (LCoS) devices, ferroelectric liquid crystal on silicon (FLCoS) devices, microshutters, microLEDs, VCSELs, liquid crystal displays (LCDs), or any solid state emitter of electromagnetic radiation.

Figure 2:
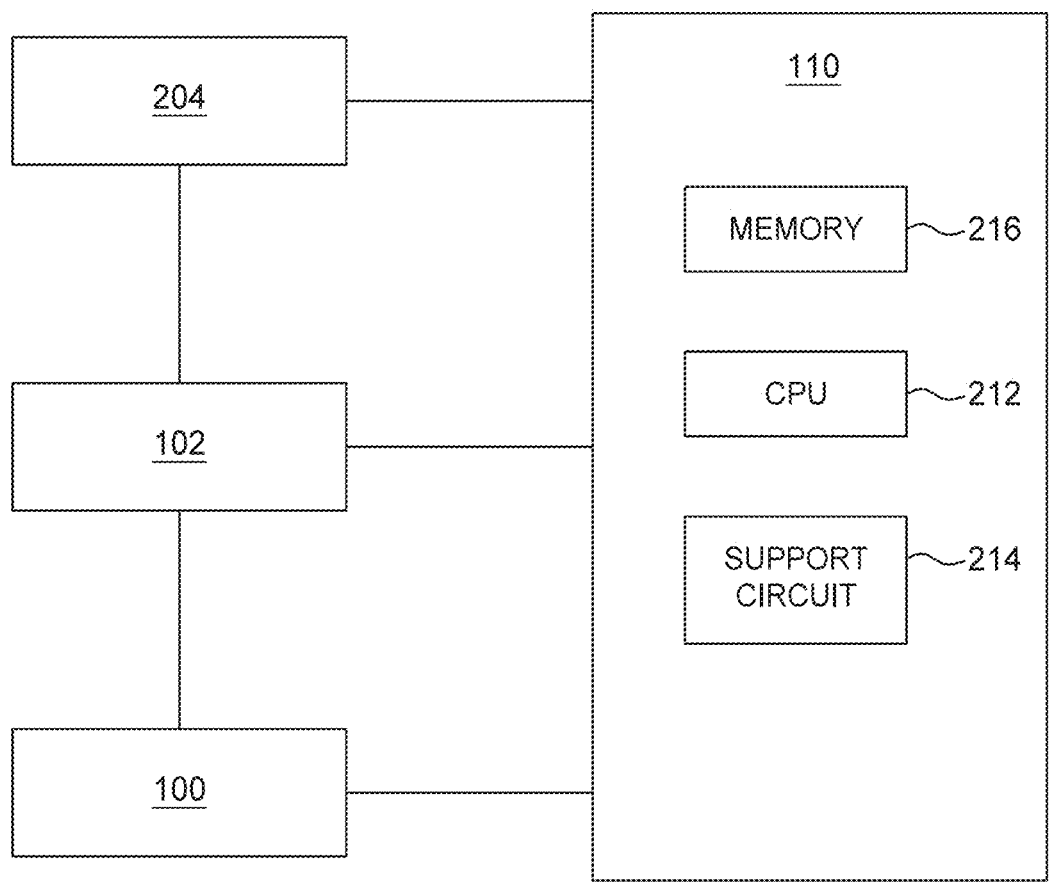
FIG. 2 is a schematic diagram of a lithography environment according to embodiments.

FIG. 2 is a schematic diagram of a lithography environment 200. As shown, the lithography environment 200 includes, but is not limited to, a digital lithography system 100, a controller 110, and communication links 101. The controller 110 is operable to facilitate the transfer of a digital pattern file 204 (e.g., data) provided to the controller 110. The controller 110 is operable to execute a virtual mask software application 102 to convert the digital pattern file 204 into a virtual mask file (not shown) having a exposure pattern readable by the processing unit 104. Each of the lithography environment devices is operable to be connected to each other via the communication links 101. Each of the lithography environment devices is operable to be connected to the controller 110 by the communication links 101. The lithography environment 200 can be located in the same area or production facility, or the each of the lithography environment devices can be located in different areas.

The controller 110 includes a central processing unit (CPU) 212, support circuits 214 and a memory 216. The CPU 212 can be one of any form of computer processor that can be used in an industrial setting for controlling the lithography environment devices. The memory 216 is coupled to the CPU 212. The memory 216 can be one or more of readily available memory, such as random access memory (RAM), read only memory (ROM), floppy disk, hard disk, or any other form of digital storage, local or remote. The support circuits 214 are coupled to the CPU 212 for supporting the processor. These circuits include cache, power supplies, clock circuits, input/output circuitry, subsystems, and the like. The controller 110 can include the CPU 212 that is coupled to input/output (I/O) devices found in the support circuits 214 and the memory 216. The controller 110 is operable to facilitate and transfer the digital pattern file 204 to the digital lithography system 100 via the communication links 101. The digital pattern file 204 is operable to be provided to the virtual mask software application 102 or the digital lithography system 100 via the controller 110.

The memory 216 can include one or more software applications, such as the virtual mask software application 102. The CPU 212 can be a hardware unit or combination of hardware units capable of executing software applications and processing data. In some configurations, the CPU 212 includes a digital signal processor (DSP), an application-specific integrated circuit (ASIC), and/or a combination of such units. The CPU 212 is configured to execute the one or more software applications, such as the virtual mask software application 102 and process the stored media data, which can be each included within the memory 216. The controller 110 controls the transfer of data and files to and from the various lithography environment devices.

The controller 110 is operable to receive exposure patterns of the virtual mask file and transfer the exposure patterns to the digital lithography system 100 via the communication links 101. The virtual mask file (or computer instructions), which may be referred to as an imaging design file, readable by the controller 110, determines which tasks are performable on a substrate. While the virtual mask software application 102 is illustrated as separate from the controller 110 (e.g., in the cloud), it is contemplated that the virtual mask software application 102 may be stored locally (e.g., in memory 216).

The virtual mask file corresponds to a pattern to be written into the photoresist using electromagnetic radiation output by the digital lithography system 100. In one embodiment, which can be combined with other embodiments described herein, the pattern may be formed with one or more patterning devices. For example, the one or more patterning devices are configured to perform ion-beam etching, reactive ion etching, electron-beam (e-beam) etching, wet etching, nanoimprint lithography (NIL), and combinations thereof. The virtual mask file may be provided in different formats. For example, the format of the virtual mask file may be one of a GDS format, and an OASIS format, among others. The virtual mask file includes information corresponding to features of exposure patterns to be generated on a substrate (e.g., the substrate 120). The virtual mask file may include areas of interest which correspond to one or more structural elements. The structural elements may be constructed as geometrical shapes (e.g., polygons).

The lithography model is a physics based model. The lithography model may use either a scalar or vector imaging model. For example, the lithography model may utilize Transmission Cross Coefficients (TCC) which is a matrix defined by optical properties and/or photoresist properties. Other numerical simulation techniques such as Resolution Enhancement Technology (RET), Optical Proximity Correction (OPC), and Source Mask Optimization (SMO) may be utilized. However, all such models and modeling techniques, whether now known or later developed, are intended to be within the scope of the present disclosure. The lithography model is constructed to be defined based on optical properties (e.g., optical properties relating to the digital lithography system 100) and the photoresist properties (e.g., properties of the photoresist of which the pattern will be printed on such as materials and processing characteristics of the photoresist). The photoresist properties include numerical aperture, exposure, illumination type, size of illumination, and wavelength, and may include other values.

Once the lithography model is constructed, the virtual mask file is input to the lithography model. The lithography model then outputs a prediction of the aerial image and resist profile of the virtual mask file. Through post-processing operations, the ILS and depth of focus of features formed in a photoresist of a substrate based on the virtual mask file may be determined. The lithography model will utilize numerical calculations to predict variables to achieve the maximum ILS and depth of focus (or a maximum ILS and depth of focus within other predefined constraints). The variables includes a width and position and a pattern bias value of the exposure patterns. The numerical calculations may be iterative methods, level-set methods, or any other numerical methods operable to solve the lithography model.

The controller 110 provides the digital pattern file 204 to the virtual mask software application 102. The virtual mask software application 102 is operable to receive the digital pattern file 204 via the communication links 101. The virtual mask software application 102 can be a vMASC software. In one embodiment, which can be combined with other embodiments described herein, the virtual mask software application 102 is a software program stored in the memory 216 of the controller 110. The CPU 212 is configured to execute the software program. In another embodiment, which can be combined with other embodiments described herein, the virtual mask software application 102 may be a remote computer server which includes a controller and a memory (e.g., data store).

The digital pattern file 204 is converted into one or more virtual mask files by the virtual mask software application 102. For example, a first virtual mask file may correspond to an exposure pattern and a second virtual mask file may correspond to another exposure pattern. The virtual mask file is a digital representation of the design to be printed by the digital lithography system 100. The virtual mask file is provided to the digital lithography system 100 via the communication links 101. The virtual mask file is stored in the digital lithography system 100.

Figure 3:
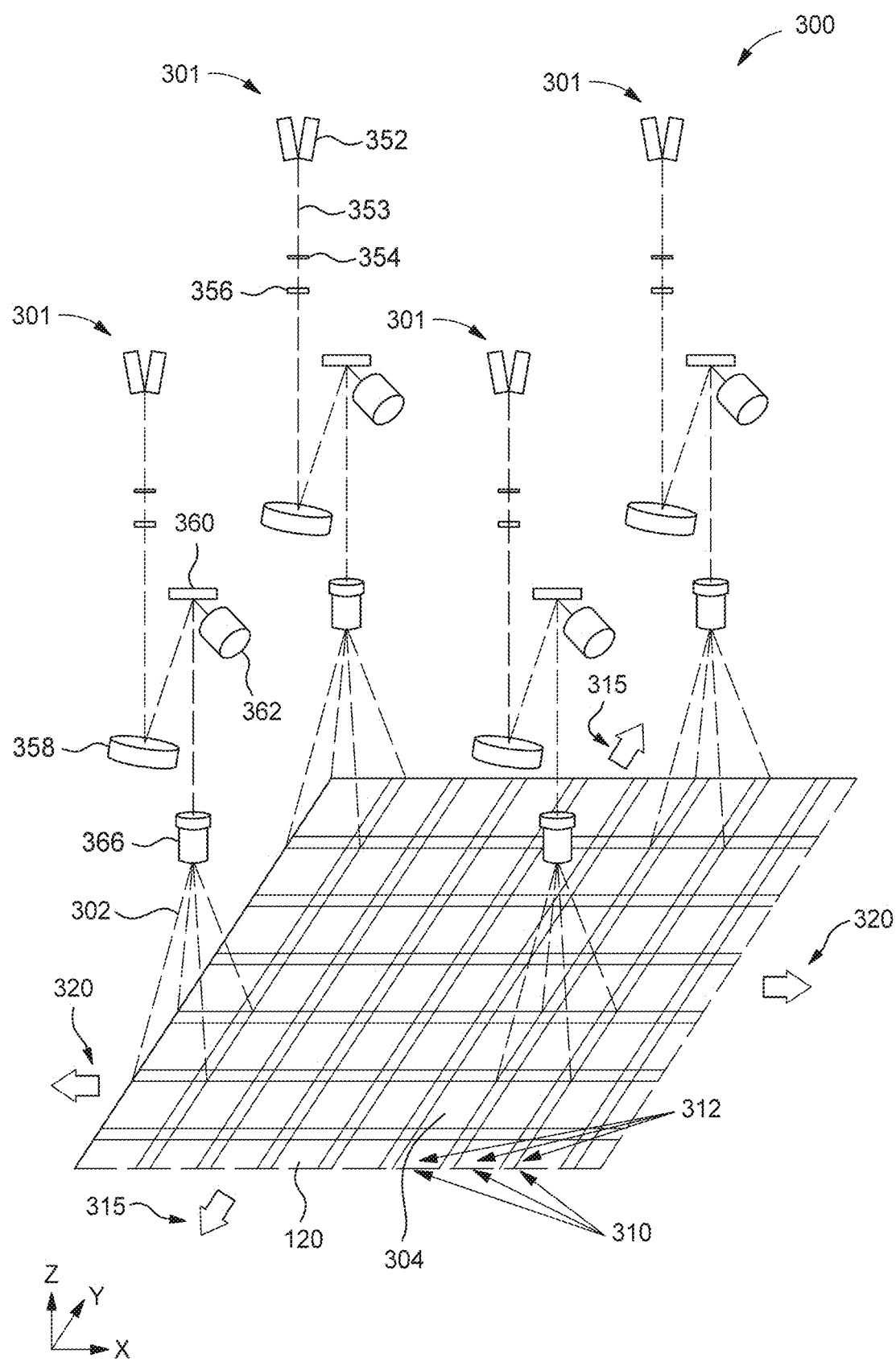
FIG. 3 is a perspective schematic view of a plurality of image projection systems according to embodiments.

FIG. 3 is a perspective schematic view 300 of a plurality of IPSs 301. As shown in FIG. 3, each IPS 301 produces a plurality of write beams 302 onto a surface 304 of the substrate 120, corresponding to a plurality of processing positions 312, along a plurality of tracks 116, each of the tracks 116 to be scanned by one or more of the write beams 302. The movement of the substrate 120 is in an in-scan direction indicated by arrow 315, while the cross-scan direction is indicated by arrow 320. As the substrate 120 moves in the in-scan direction and cross-scan direction, the entire surface 304 may be patterned by the write beams 302. The number of the IPSs 301 may vary based on the size of the substrate 120 and/or the speed of stage 114. In one embodiment, there are 10 IPSs 301 in the processing unit 104.

The IPSs 301 includes a spatial light modulator (SLM) 360 and projection optics 366. The components of the IPS 301 vary depending on the SLM 360 being used. The SLM 360 includes, but is not limited to, an array of microLED's, VCSEL's, liquid crystal displays (LCDs), or any solid-state emitter of electromagnetic radiation, and a digital mirror device (DMD). The SLM 360 includes a plurality of spatial light modulator pixels. Each SLM pixel of the plurality of SLM pixels are individually controllable and are configured to project a write beam corresponding to a pixel of the plurality of pixels. The compilation of plurality of pixels form the pattern written into the photoresist, referred to herein as the mask pattern. The projection optics 366 includes projection lenses, for example, 10× objective lenses, used to project the light onto the substrate 120. In operation, based on the mask pattern data provided to the SLM 360 by the controller 110, each SLM pixel of the plurality of SLM pixels is at an "on" position or "off" position. Each SLM pixel at an "on" position forms a write beam that the projection optics 366 then projects the write beam to the photoresist layer surface of the substrate 120 to form a pixel of the mask pattern.

In one embodiment, SLM 360 is a DMD. The IPS 301 includes a light source 352, an aperture 354, a lens 356, a frustrated prism assembly 358, the SLM 360, and the projection optics 366. In this embodiment, the SLM 360 includes a plurality of mirrors, e.g., the plurality of spatial light modulator pixels. Each mirror of the plurality of mirrors corresponds to a pixel that may correspond to a pixel of the mask pattern. In some embodiments, the DMD includes more than about 4,000,000 mirrors, while in other embodiments may include 1920×1080 mirrors, which represent the number of pixels of a high definition television. The light source 352 is any suitable light source, such as a light emitting diode (LED) or a laser, capable of producing a light having a predetermined wavelength. In one embodiment, the predetermined wavelength is in the blue or near ultraviolet (UV) range, such as less than about 450 nm. The frustrated prism assembly 358 includes a plurality of reflective surfaces. In operation, a light beam 453 having is produced by the light source 352. The light beam 353 is reflected to the DMD by the frustrated prism assembly 358. When the light beam reaches the mirrors of the DMD, each mirror at "on" position reflect the light beam 353, i.e., forms a write beam, also known as a "shot", that the projection optics 366 then projects to shot the photoresist layer surface of the substrate 120. The plurality of write beams 302, also known as a plurality of shots, forms a plurality of pixels of the mask pattern.

Figure 4:
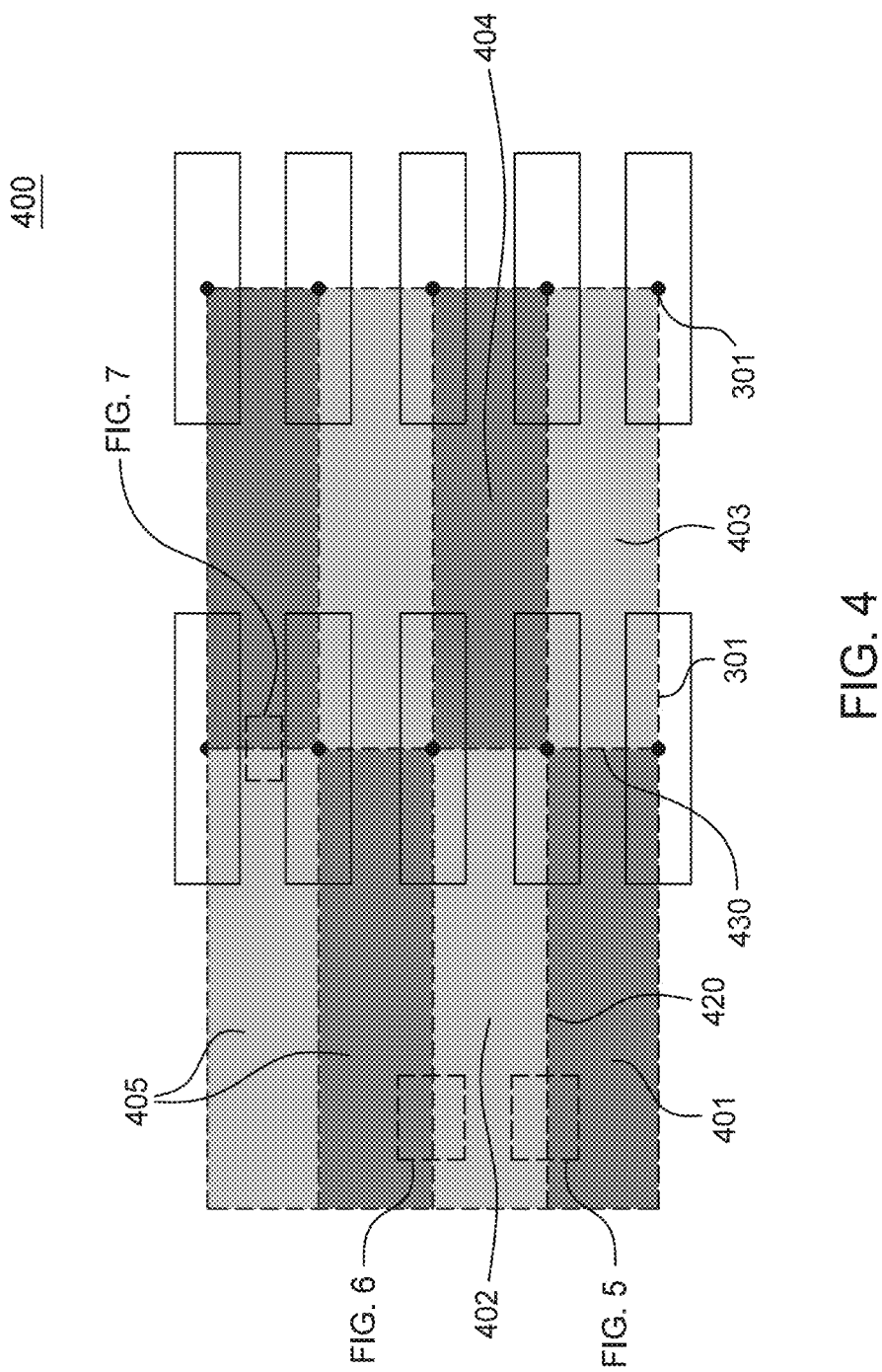
FIG. 4 is a top down view of a portion of a substrate underneath the processing unit according to embodiments.

FIG. 4 is a top down view of a portion 400 of a substrate 120 underneath the processing unit 104. The substrate is divided into sections 405 defining eye to eye (E2E) boundaries 420 and bridge to bridge (B2B) boundaries 430. As shown in FIG. 4 there are 10 IPSs 301. In this example, the substrate 120 is divided into eight sections 405. The sections 405 include at least one first section 401, one second section 402, one third section 403, and one fourth section 404. Each of the sections 405 have a section pattern. Boundaries between first section 401 and a second section 402 which are along a column of IPSs 301 are E2E boundaries 420. The boundary between the third section 403 and the fourth section 404 are also E2E boundaries. Boundaries between first section 401 and a third section 403 which are along a row of IPSs 301 are B2B boundaries 430. The boundary between the second section 402 and the fourth section 404 are also B2B boundaries 430. Each IPS is operable to expose a respective section (i.e., one of a first section 401, a second section 402, and a third section 403, and a fourth section 404) pattern the sections 405 to a section pattern and a portion of a section on the E2E boundary 420, and another portion of a section of the B2B boundary 430. For example, for an IPS 301 the exposure area corresponds to the first section 401, a portion of the second section 402 on the E2E boundary 420, a portion of the third section 403 on the B2B boundary 430, and another portion of a fourth section 404 where the E2E boundary 420 and the B2B boundary 430 meet. For an IPS 301 the exposure area corresponds to the second section 402, a portion of the first section 401 on the E2E boundary 420, a portion of the fourth section 404 on the B2B boundary 430, and another portion of a third section 403 where the E2E boundary 420 and the B2B boundary 430 meet.

Figure 5:
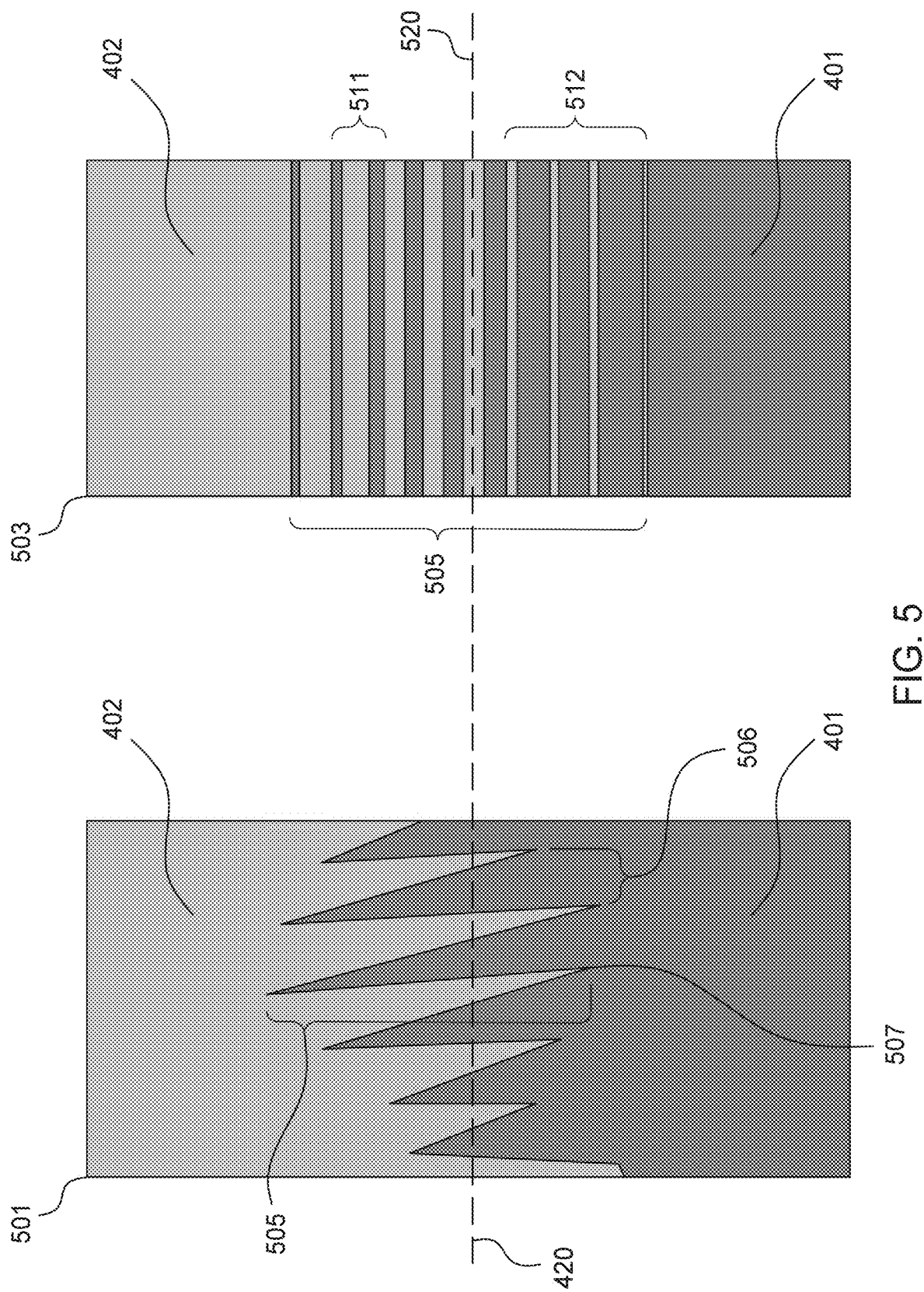
FIG. 5 is a section of an eye to eye boundary according to a single exposure method according to embodiments.

FIG. 5 is a section of an E2E boundary 420 according to a single exposure method. A midpoint line 520 depicts the separation of the first section 401 and the second section 402 at the E2E boundary 420. The description herein also applies to the E2E boundary 420 of the third section 403 and the fourth section 404. In order to make the E2E boundary 420 invisible to the human eye, the IPS 301 for the first section 401 exposes a pattern in the second section 402 as well as the section pattern in the first section 401. Likewise the IPS 301 for the second section 402 exposes a pattern in the first section 401 as well as the section pattern in the second section 402. As shown in a first embodiment 501 first triangles of the exposure pattern of the first section 401 overlap into the second section 402. Second triangles of the exposure pattern of the second section 402 overlap into the first section 401. The height 505, width 506, and angle 507 of the exposure pattern of the first section 401 and the exposure pattern of the second section 402 can vary and are selected to reduce mura. This ensures that both the first section 401 and the second section 402 are completely patterned and the E2E boundary 420 is invisible to the human eye.

In the second embodiment 503, first lines of the exposure pattern of the first section 401 overlap into the second section 402. Second lines of the exposure pattern of the second section 402 overlap into the first section 401. The pitch 511 and thickness 512 of the lines in the exposure pattern of the first section 401 and the exposure pattern of the second section 402 can vary and are selected to reduce mura. The height of the pattern from the farthest first line in the second section 402 to the farthest second line in the first section 401 can vary. This ensures that both the first section 401 and the second section 402 are completely patterned and the E2E boundary 420 is invisible to the human eye.

Figure 6:
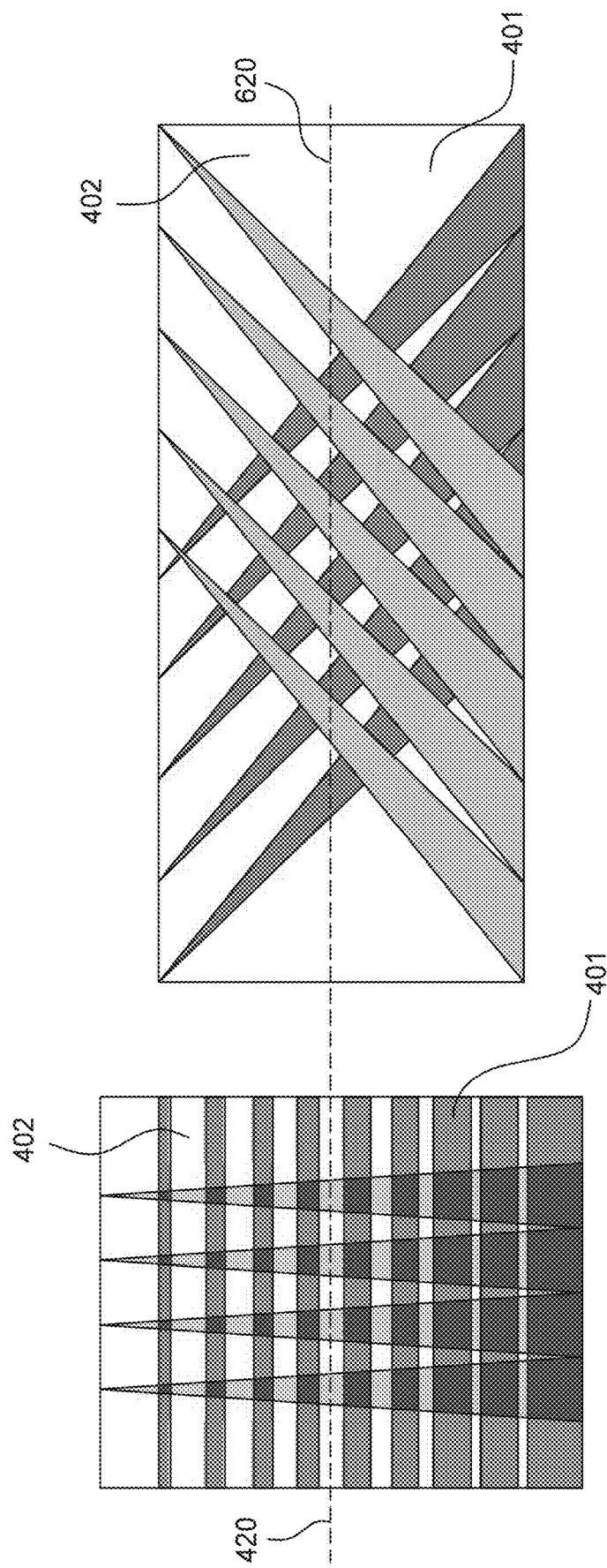
FIG. 6 is a section of an eye to eye boundary according to a double exposure method according to embodiments.

FIG. 6 is a section of an E2E boundary 420 according to a double exposure method. A midpoint line 620 depicts the separation of the first section 401 and the second section 402 at the E2E boundary 420. The description herein also applies to the E2E boundary 420 between the third section 403 and the fourth section 404. In order to make the E2E boundary 420 invisible to the human eye, the IPS 301 for the first section 401 exposes a pattern in the second section 402. Likewise the IPS 301 for the second section 402 exposes a pattern in the first section 401. In these embodiments the IPS 301 for the first section 401 and the IPS 301 for the second section 402 make two passes under the processing unit 104. In the first embodiment, only a plurality of patterns from the IPS 301 for the first section 401 is shown. The first pass is a triangles where the triangles expand from the first section 401 to the second section 402. The height of this pattern can vary as can the width between the pattern and the angle of the pattern. The second pass are lines where the lines expand from the first section 401 into the second section 402. A pitch and a thickness of the lines varies. While not depicted, the description herein applies to each E2E boundary and each B2B boundary when scanned under a respective IPS 301.

In the second embodiment only a plurality of patterns from the IPS 301 for the first section 401 is shown. The first pass is a set of first triangles that expands from the first section 401 into the second section 402. The height of this pattern can vary as can the width between the pattern and the angle of the pattern. The second pass is a set of second triangles that expands from the first section 401 into the second section 402. The height of this pattern can vary as can the width between the pattern and the angle of the pattern. However the angle of the second set of triangles is the supplementary angle of the first set of triangles. While not depicted, the description herein applies to each E2E boundary 420 and each B2B boundary 430 when scanned under a respective IPS 301.

FIG. 7 is a section of a B2B boundary 430 according to a single exposure method. A midpoint line 730 depicts the separation of the first section 401 and the third section 403 at the B2B boundary 430. This figure could also depict the B2B boundary 430 between the second section 402 and the fourth section 404. In order to make the B2B boundary 430 invisible to the human eye, the IPS 301 for the first section 401 exposes a pattern in the third section 403 as well as the section pattern for the first section 401. Likewise the IPS 301 for the third section 403 exposes a pattern in the first section 401 as well as the section pattern for the third section 403. First lines of the pattern of the first section 401 overlap into the second section 402. Second lines of the pattern of the second section 402 overlap into the first section 401. The pitch 750 and thickness of the lines in the patterns can vary and are controlled to reduce mura. The height of the pattern from the farthest first line in the second section 402 to the farthest second line in the first section 401 can vary. This ensures that both the first section 401 and the second section 402 are completely patterned and the B2B boundary 430 is invisible to the human eye.

FIG. 8 is a portion of a substrate at an E2E boundary 420 and a B2B boundary 430. The E2E and B2B form a first quadrant 801, a second quadrant 802, a third quadrant 803, and a fourth quadrant 804. The first quadrant 801 corresponds to a segment of the first section 401. The second quadrant 802 corresponds to a segment of the second section 402. The third quadrant 803 corresponds to a segment of the third section 403. The fourth quadrant 804 corresponds to a segment of the fourth section 404. In the first quadrant 801 first triangles are formed and extend from the first quadrant 801 into the second quadrant 802. In the second quadrant 802 second triangles are formed and extend from the second quadrant 802 into the first quadrant 801. The height, width, and angle of the first and second triangles can vary and are controlled to reduce mura. In the third quadrant 803, third triangles are formed and extend from the third quadrant 803 into the fourth quadrant 804. In the fourth quadrant 804 fourth triangles are formed and extend from the fourth quadrant 804 into the third quadrant 803. The height, width, and angle of the first and second triangles can vary and are controlled to reduce mura. In the first quadrant 801 first lines are formed that have the equivalent patterns of the first triangles and extend from the first quadrant 801 into the third quadrant 803. In the second quadrant 802 second lines are formed that have the equivalent patterns of the second triangles and extend from the second quadrant 802 into the fourth quadrant 804. In the third quadrant 803 first lines are formed that have the equivalent patterns of the third triangles and extend from the third quadrant 803 into the first quadrant 801. In the fourth quadrant 804 fourth lines are formed that have the equivalent patterns of the fourth triangles and extend from the fourth quadrant 804 into the second quadrant 802. The first, second, third, and fourth lines have a pitch 850 and a thickness that can vary and are controlled to reduce mura. Since the triangle and corresponding line have the same pattern all four quadrants are completely filled with pattern as shown in FIG. 8.

Figure 9:
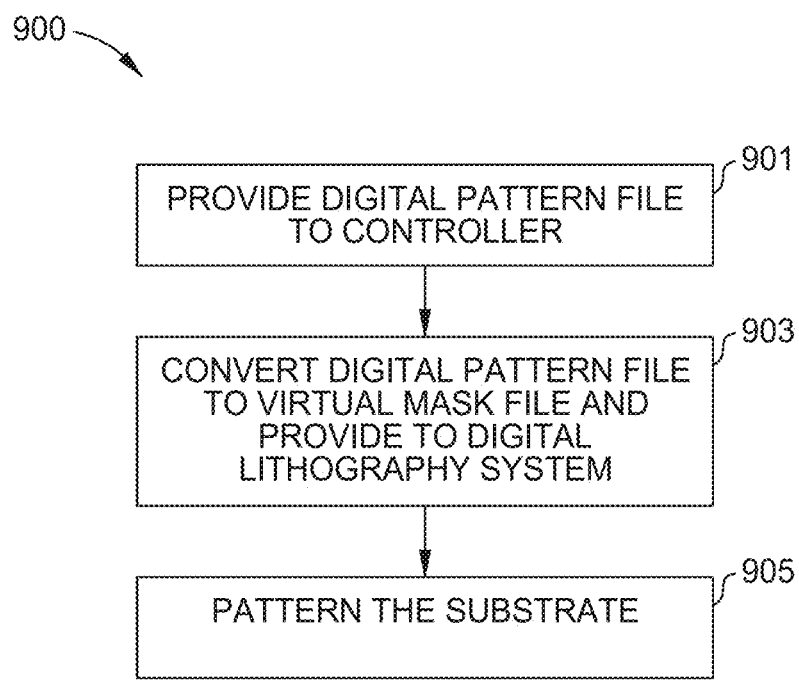
FIG. 9 is a flow diagram of a method of digital lithography according to embodiments.

FIG. 9 is a flow diagram of a method 900 of digital lithography. At operation 901, a digital pattern file 204 is provided to a controller 110. The controller 110 is operable to execute a virtual mask software application 102. The digital pattern file 204 which is converted to a virtual mask file corresponds to a pattern to be written into a photoresist using electromagnetic radiation output by the digital lithography system 100 (shown in FIG. 1). At operation 903, the virtual mask file is provided to the digital lithography system 100. The virtual mask file includes the exposure pattern for the sections 405 (the section pattern), the E2E boundaries 420, and the B2B boundaries 430. In one embodiment the E2E boundaries 420 are patterned according to the description of FIG. 5. In another embodiment the E2E boundaries 420 are patterned according to the description of FIG. 6. In another embodiment which can be combined with other embodiments the B2B boundary 430 is patterned according to the description of FIG. 7. In yet another embodiment the E2E boundary 420 and the B2B boundary 430 is patterned as described FIG. 8, the digital lithography system 100 performs a lithography process to expose a substrate to the exposure patterns included in the virtual mask file. At operation 905, the IPSs 301 pattern the substrate 120 according to the virtual mask file.

While the foregoing is directed to examples of the present disclosure, other and further examples of the disclosure may be devised without departing from the basic scope thereof, and the scope thereof is determined by the claims that follow.

What is claimed is:

1. A system, comprising:
   a processing unit configured to print a virtual mask file provided by a controller in communication with the processing unit, wherein the controller is configured to:
   receive data and convert the data into the virtual mask file having a exposure pattern for a lithographic process, the exposure pattern including a plurality of first sections, second sections, third sections, and fourth sections, wherein:
      each first section forms an eye to eye (E2E) boundary with each second section along a first column of image projection systems (IPSs) of the processing unit;
      each third section forms the E2E boundary with each fourth section along a second column of IPSs of the processing unit;
      each first section forms a bridge to bridge (B2B) boundary with each third section along a first respective row of IPSs of the processing unit;
      each second section forms the B2B boundary with each fourth section along a second respective row of image projection systems (IPSs) of the processing unit; and
   pattern with the processing unit using the virtual mask file, wherein the virtual mask file includes:
      a first section pattern of each first section that crosses the E2E boundary with the second section and the B2B boundary with the third section;
      a second section pattern of each second section that crosses the E2E boundary with the first section and the B2B boundary with the fourth section;
      a third section pattern of each third section that crosses the E2E boundary with the fourth section and the B2B boundary with the second section; and
      a fourth section pattern of each fourth section that crosses the E2E boundary with the third section and the B2B boundary with the first section.

2. The system of claim 1, wherein the first section pattern, second section pattern, third section pattern, and fourth section pattern that crosses the E2E boundary includes plurality of triangles.

3. The system of claim 1, wherein the first section pattern, second section pattern, third section pattern, and fourth section pattern that crosses the E2E boundary includes a plurality of lines.

4. The system of claim 1, wherein the first section pattern, second section pattern, third section pattern, and fourth section pattern that crosses the B2B boundary includes a plurality of lines.

5. The system of claim 1, wherein the IPSs are array of electrically addressable elements.

6. The system of claim 1, wherein electrically addressable elements include digital micromirrors, liquid crystal displays (LCDs), liquid crystal over silicon (LCoS) devices, ferroelectric liquid crystal on silicon (FLCoS) devices, microshutters, microLEDs, VCSELs, liquid crystal displays (LCDs), or any solid state emitter of electromagnetic radiation.

7. The system of claim 1, further comprising a stage configured to support a substrate.

8. A method, comprising:
   patterning with a processing unit a substrate having a photoresist disposed thereon with an exposure pattern of a virtual mask file, the exposure pattern including a plurality of first sections, second sections, third sections, and fourth sections, wherein:
      each first section forms an eye to eye (E2E) boundary with each second section along a first column of image projection systems (IPSs) of the processing unit;
      each third section forms the E2E boundary with each fourth section along a second column of IPSs of the processing unit;
      each first section forms a bridge to bridge (B2B) boundary with each third section along a first respective row of IPSs of the processing unit;
      each second section forms the B2B boundary with each fourth section along a second respective row of IPSs of the processing unit;
      a first section pattern of each first section crosses the E2E boundary with the second section and the B2B boundary with the third section;
      a second section pattern of each second section crosses the E2E boundary with the first section and the B2B boundary with the fourth section;
      a third section pattern of each third section crosses the E2E boundary with the fourth section and the B2B boundary with the second section; and
      a fourth section pattern of each fourth section crosses the E2E boundary with the third section and a B2B boundary with the first section.

9. The method of claim 8, wherein the first section pattern, second section pattern, third section pattern, and fourth section pattern that crosses the E2E boundary is a plurality of triangles.

10. The method of claim 8, wherein the first section pattern, second section pattern, third section pattern, and fourth section pattern that crosses the E2E boundary is a plurality of lines.

11. The method of claim 8, wherein the first section pattern, second section pattern, third section pattern, and fourth section pattern that crosses the B2B boundary is a plurality of lines.

12. The method of claim 8, wherein the IPSs are array of electrically addressable elements.

13. The method of claim 12, wherein electrically addressable elements include digital micromirrors, liquid crystal displays (LCDs), liquid crystal over silicon (LCoS) devices, ferroelectric liquid crystal on silicon (FLCoS) devices, microshutters, microLEDs, VCSELs, or liquid crystal displays (LCDs).

14. The method of claim 8, further comprising:
   providing a digital pattern file of data to a controller; and
   converting the data into the virtual mask file having the exposure pattern for a lithographic process.

15. A non-transitory computer-readable medium storing instructions that, when executed by a processor, cause a computer system to perform the steps of:
   patterning with a processing unit an exposure pattern of a virtual mask file, the exposure pattern including a plurality of first sections, second sections, third sections, and fourth sections, wherein:

each first section forms an eye to eye (E2E) boundary with each second section along a first column of image projection systems (IPSs) of the processing unit;

each third section forms the E2E boundary with each fourth section along a second column of IPSs of the processing unit;

each first section forms a bridge to bridge (B2B) boundary with each third section along a first respective row of IPSs of the processing unit;

each second section forms an B2B boundary with each fourth section along a second respective row of IPSs of the processing unit; and a first section pattern of each first section crosses the E2E boundary with the second section and the B2B boundary with the third section;

a second section pattern of each second section crosses the E2E boundary with the first section and the B2B boundary with the fourth section;

a third section pattern of each third section crosses the E2E boundary with the fourth section and the B2B boundary with the second section; and a fourth section pattern of each fourth section crosses the E2E boundary with the third section and the B2B boundary with the first section.

16. The non-transitory computer-readable medium of claim 15, wherein the first section pattern, second section pattern, third section pattern, and fourth section pattern that crosses the E2E boundary is a plurality of triangles.

17. The non-transitory computer-readable medium of claim 15, wherein the first section pattern, second section pattern, third section pattern, and fourth section pattern that crosses the E2E boundary is a plurality of lines.

18. The non-transitory computer-readable medium of claim 15, wherein the first section pattern, second section pattern, third section pattern, and fourth section pattern that crosses the B2B boundary is a plurality of lines.

19. The non-transitory computer-readable medium of claim 15, wherein the IPSs are array of electrically addressable elements.

20. The non-transitory computer-readable medium of claim 15, wherein the computer system further performs the steps of:

providing a digital pattern file of data to a controller;
converting the data into the virtual mask file having the exposure pattern for a lithographic process; and
providing the virtual mask file with the controller to a digital lithography system.

21. A system, comprising:
a processing unit configured to print a virtual mask file provided by a controller in communication with the processing unit, wherein the controller is configured to:

receive data and convert the data into the virtual mask file having a exposure pattern for a lithographic process, the exposure pattern including a plurality of first sections and second sections, wherein:
each first section forms an eye to eye (E2E) boundary with each second section along a first column of image projection systems (IPSs) of the processing unit;
pattern with the processing unit using the virtual mask file, wherein the virtual mask file includes:
a first section pattern of each first section that crosses the E2E boundary with the second section; and
a second section pattern of each second section that crosses the E2E boundary with the first section.

22. The system of claim 21, further comprising:
receive the exposure pattern further including a third section, wherein:
each first section forms a bridge to bridge (B2B) boundary with each third section along a first respective row of IPSs of the processing unit; and
pattern with the processing unit using the virtual mask file, wherein the virtual mask file further includes:
the first section pattern of each first section that crosses the B2B boundary with the third section.

23. The system of claim 22, further comprising:
receive the exposure pattern further including a fourth section, wherein:
each third section forms the E2E boundary with each fourth section along a second column of IPSs of the processing unit;
each second section forms the B2B boundary with each fourth section along a second respective row of IPSs of the processing unit; and
pattern with the processing unit using the virtual mask file, wherein the virtual mask file includes:
the second section pattern of each second section the B2B boundary with the fourth section;
a third section pattern of each third section that crosses the E2E boundary with the fourth section and the B2B boundary with the second section; and
a fourth section pattern of each fourth section that crosses the E2E boundary with the third section and the B2B boundary with the first section.

24. The system of claim 23, wherein the IPSs are array of electrically addressable elements.

25. The system of claim 23, wherein electrically addressable elements include digital micromirrors, liquid crystal displays (LCDs), liquid crystal over silicon (LCoS) devices, ferroelectric liquid crystal on silicon (FLCoS) devices, microshutters, microLEDs, VCSELs, liquid crystal displays (LCDs), or any solid state emitter of electromagnetic radiation.

* * * * *